(12) United States Patent
Mills et al.

(10) Patent No.: US 6,178,091 B1
(45) Date of Patent: Jan. 23, 2001

(54) COMPUTER SYSTEM HAVING SURFACE MOUNT PWB GROUNDING CLIPS

(75) Inventors: Richard Steven Mills, Austin; George Thomas Holt, Round Rock; Patricia Herman, Austin, all of TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/112,525

(22) Filed: Jul. 9, 1998

(51) Int. Cl.$^7$ ........................................... H05K 5/00
(52) U.S. Cl. ..................... 361/756; 361/752; 361/799; 361/800; 361/801; 174/35 R; 439/95
(58) Field of Search ....................... 361/724–730, 361/752, 753, 756, 759, 749, 800–802, 816, 818, 807–810; 439/377; 174/35 R, 40 CC; 434/95, 75, 826

(56) References Cited

U.S. PATENT DOCUMENTS

| | | | |
|---|---|---|---|
| Re. 35,915 | * 10/1998 | Hastings et al. | 439/377 |
| 2,869,107 | 1/1959 | Engel . | |
| 4,616,893 | 10/1986 | Feldman | 439/108 |
| 4,640,561 | 2/1987 | George | 439/77 |
| 4,643,509 | 2/1987 | Hollyday | 439/607 |
| 4,755,147 | 7/1988 | Young | 439/77 |
| 4,907,975 | 3/1990 | Dranchak et al. | 439/67 |
| 4,921,431 | 5/1990 | Garay et al. | 439/79 |
| 5,080,597 | 1/1992 | Seidel et al. | 439/108 |
| 5,138,529 | * 8/1992 | Colton et al. | 361/816 |
| 5,267,125 | 11/1993 | Liu | 361/816 |
| 5,313,596 | * 5/1994 | Swindler et al. | 395/325 |
| 5,386,346 | * 1/1995 | Gleadall | 361/799 |
| 5,388,030 | * 2/1995 | Gasser et al. | 361/818 |
| 5,391,098 | 2/1995 | Ohashi | 439/830 |
| 5,451,167 | 9/1995 | Zielinski et al. | 439/92 |
| 5,452,184 | * 9/1995 | Scholder et al. | 361/799 |
| 5,463,532 | * 10/1995 | Petitpierre et al. | 361/800 |
| 5,513,996 | * 5/1996 | Annerino et al. | 439/95 |
| 5,613,860 | 3/1997 | Banakis et al. | 439/64 |
| 5,626,488 | * 5/1997 | Albeck et al. | 439/395 |
| 5,647,748 | 7/1997 | Mills et al. | 439/81 |

* cited by examiner

Primary Examiner—Jayprakash N. Gandhi
Assistant Examiner—Tuan Dinh
(74) Attorney, Agent, or Firm—Haynes and Boone, L.L.P.

(57) ABSTRACT

A computer chassis includes a hook extending from a chassis surface. A component board is mounted in the chassis so that the hook extends through a slot in the board. A pair of grounding clips are surface mounted on the board on opposite sides of the slot so that a retainer portion of each clip engages opposite surfaces of the hook. The retainer portions have an opening for surface mounting the clips on the board by a pick-and-place vacuum workpiece.

18 Claims, 4 Drawing Sheets

COMPUTER SYSTEM HAVING SURFACE MOUNT PWB GROUNDING CLIPS

BACKGROUND

The disclosures herein relate generally to computer systems and more particularly to a ground clip for connecting a ground plane of a printed wiring board to a computer chassis.

There have been many conventional mechanisms used to electrically connect a chassis to a ground conductor. One popular mechanism involves placing a screw through a printed wiring board (PWB) and into the chassis. At the upper surface of the board is a conductive solder pad, onto which the lower surface of the screw head is designed to abut. The solder pad is coupled to the ground conductor through a via. The via is configured on the exposed planar surface of the board and/or is buried within the board itself. By tightening the screw into the chassis, the backside surface of the screw head contacts the solder pad resulting in an electrical path from the chassis to the ground conductor by way of the screw, solder pad and via.

It is necessary that not only the hole through the board into which the screw is placed be aligned with the hole in the chassis, but it is also necessary that a via be reliably formed between the solder pad arranged on the upper surface of the board and all ground conductors formed upon and/or within the board. Placement of the screw is not only tedious and time consuming, but also must be performed with extreme care. Any slip of the tightening tool from the screw head to the board upper surface could not only damage the printed conductors or vias arranged thereon, but could also, in extreme cases, pierce or crack the insulative glass fiber laminate of the board.

Still further, tightening of the screw head backside surface upon the solder pad can dislodge solder particles from the solder pad which can migrate from the solder pad and possibly lodge between printed conductors, edge-board contacts and/or receptor contacts. Vibration or any type of relative motion between the screw head and underlying board caused, for example, by an operable electronic device or periodic movement of that device can, over time, result in reliability problems. Movement of the electronic device may cause the screw to loosen in a counter fashion or, more likely, movement of the device may dislodge solder underneath the head as the head moves relative to the solder pad. Movement of the head causes the head to sweep the relatively soft solder from the pad, resulting in eventual separation between the head and the solder pad.

Any separation between the grounded screw and the solder pad will force an open circuit therebetween. An improperly grounded ground conductor can affect the operability of each and every component coupled to the ground conductor. It is therefore important that an alternative chassis-to-ground conductor connection be made which is less labor intensive, is less prone to user error, is less susceptible to solder being dislodged during assembly and operation, and is generally more reliable.

Failure to provide a good ground path between a printed wiring board and the computer chassis results in poor electromagnetic interference (EMI) performance. In the past, a combination of screws and solder pads on the PWB have been used to provide a ground path from the PWB to the computer chassis. These methods, although cost effective, are neither repeatable nor reliable. Furthermore, their effectiveness is dramatically reduced each time the PWB is installed and removed.

One attempt at providing an improvement is disclosed in U.S. Pat. No. 5,647,748. This approach provides a printed circuit board grounding clip having upwardly extending retainers and downwardly extending legs. The legs are designed to insert within plated through-holes of a variable thickness printed circuit board. The upwardly extending retainers terminate as a spaced pair of flanges which frictionally receive and electrically couple with a hook. The hook extends from the chassis of an electronic device, through a slot within the PWB and between the spaced flanges. Accordingly, the hook and ground clip form an electrical conduit between a ground supply connected to the electronic device chassis and a ground conductor formed within the PWB. Chassis-to-ground conductor attachment is performed during assembly of the board to the chassis backplane. Attachment can be quickly and easily reversed to allow board re-work, without requiring placement of heat upon the board. The present attachment mechanism further avoids user-inserted fasteners and the reliability problems they present.

Although the above-described grounding clip represents a substantial improvement, there are limitations. First, the installed cost is high when compared to previous methods and devices. Also, the clips are installed into the PWB by hand which increases labor cost. In addition, the clips are prone to being deformed during installation which affects their performance. Further, due to their complex configuration, a plurality of these clips stored together, tend to become entangled and are difficult to separate. If care is not taken during separation, damage to the clips may easily occur.

Therefore, what is needed is a surface mount grounding clip which is relatively non-complex, physically robust, and can be used in pick-and-place assembly used for other components being installed in the manufacturing process.

SUMMARY

One embodiment, accordingly, provides a surface mount grounding clip of a robust configuration, applicable to pick-and-place assembly and formed of a highly conductive metallic material. To this end, a surface mount grounding clip comprises a base portion and a retainer portion which extends angularly away from the base portion. The retainer portion includes an opening formed therein and an edge which has a lip extending at an angle relative to the retainer portion.

A principal advantage of this embodiment is that installation and part costs are reduced. In addition, the clip is compatible with a surface mount technology (SMT) assembly process. The clip is structurally robust and not as prone to damage during assembly or use as previous devices.

DETAILED DESCRIPTION OF THE PREFERRED EMBODIMENT

Figure 1:
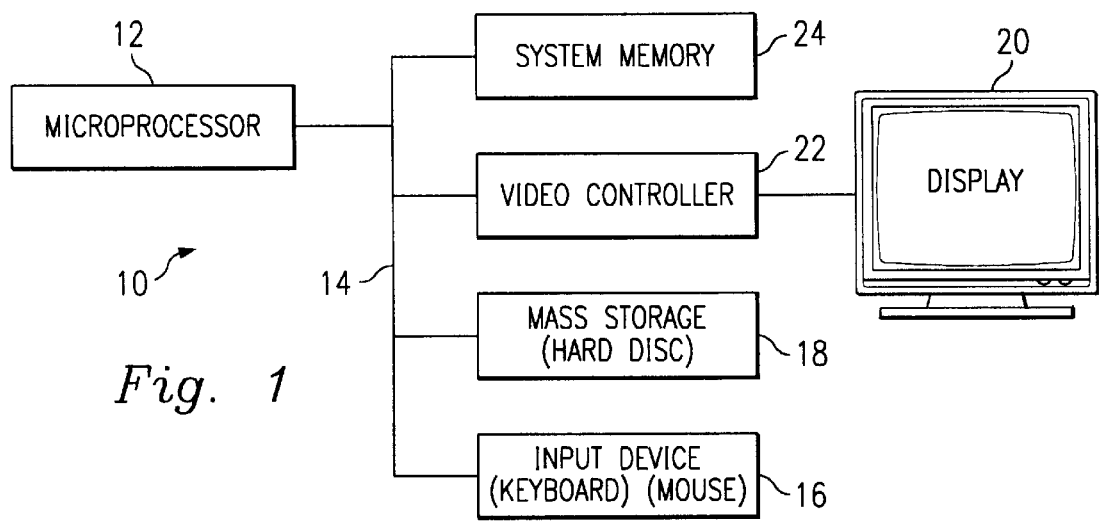
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
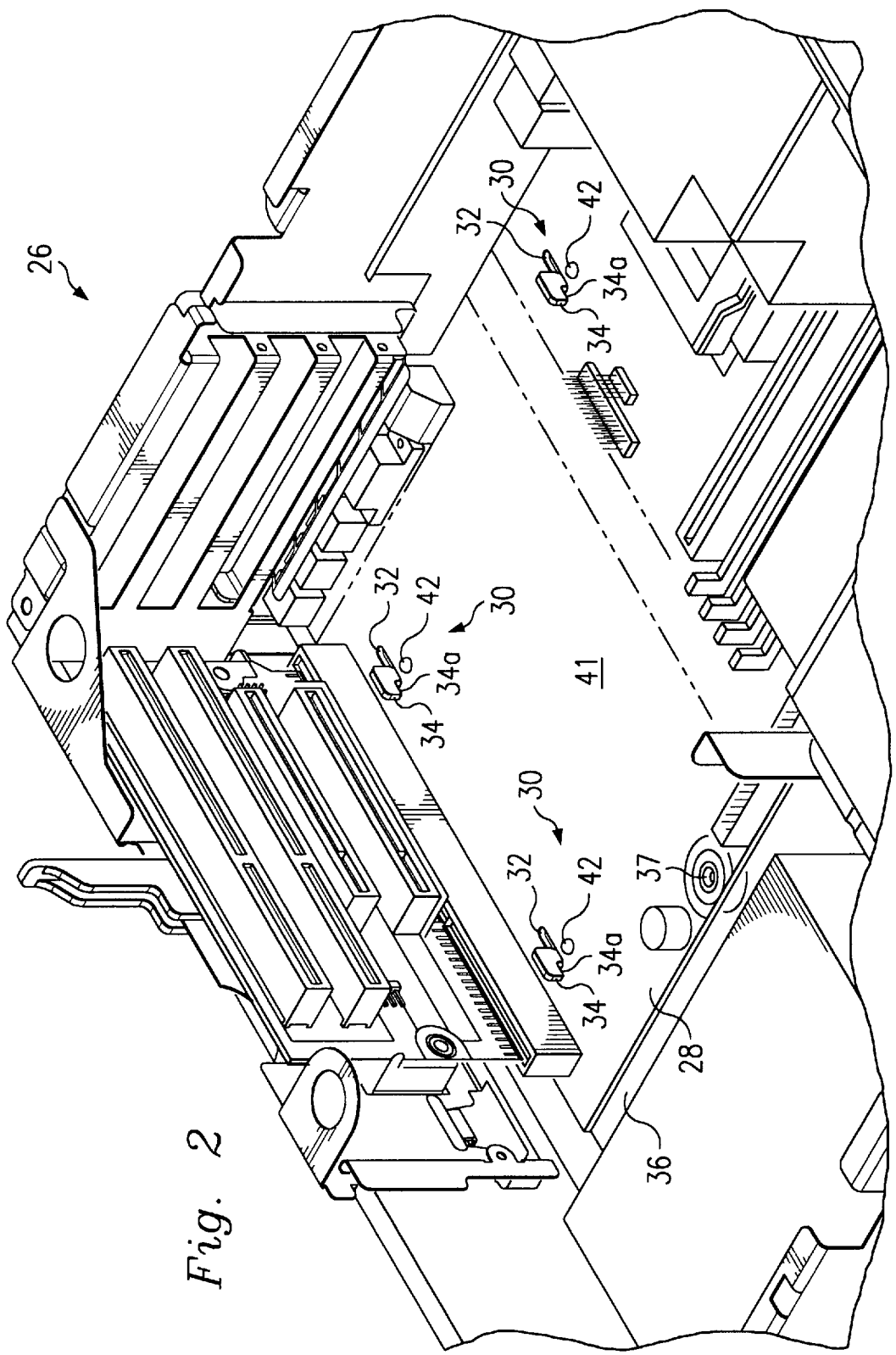
FIG. 2 is an isometric view illustrating an embodiment of a portion of a computer chassis.

Computer system 10, described above, includes components housed in a computer chassis 26, FIG. 2. A component board 28, such as a PWB, is mounted in chassis 26 and includes at least one ground connection, such as those generally designated 30. Board 28 includes a plurality of slots 32 formed therein which align with associated dual-purpose grounding and retaining hooks 34 extending from a surface 36 of chassis 26. Hooks 34 include an undercut 34a so that after the hooks 34 are inserted through slots 32, board 28 is shifted permitting undercut 34a to slide over and mechanically engage board 28, as is well known. In addition, usually one threaded fastener 37 is used to secure board 28 to limit a board shift and the possibility that hooks 34 could become dislodged from slots 32.

Figure 3:
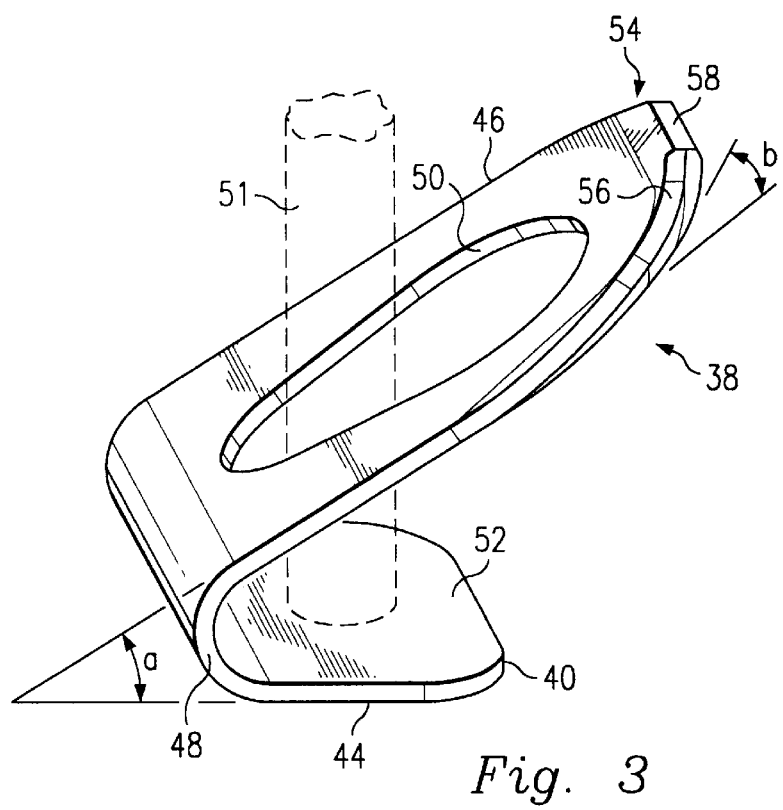
FIG. 3 is an isometric view illustrating an embodiment of a grounding clip.
Figure 4:
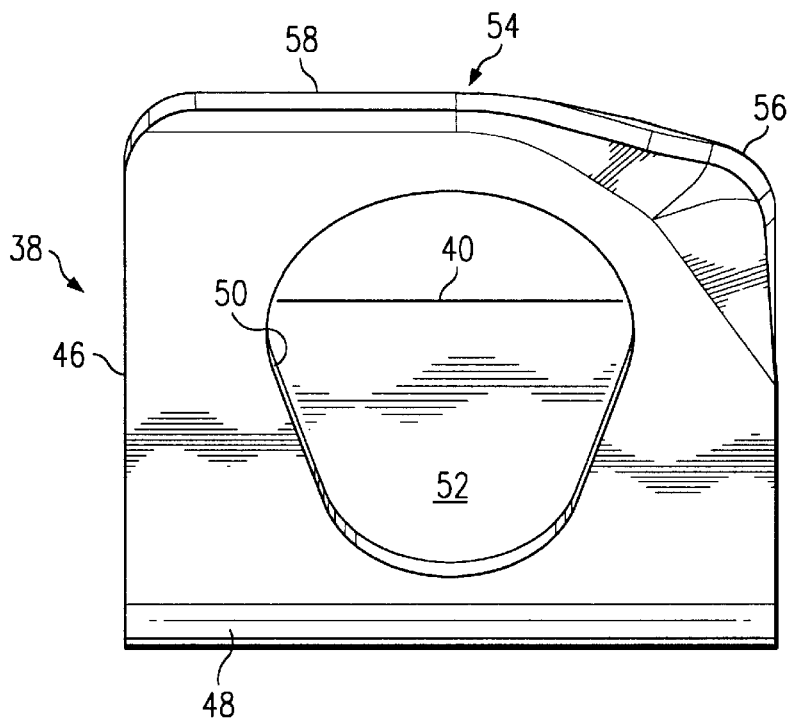
FIG. 4 is a top view illustrating the grounding clip of FIG. 3.

A surface mount grounding clip 38, FIGS. 2, 3 & 4, is used to provide a ground path from the PWB 28 to the chassis 26. Clip 38 is formed of a highly conductive metal such as beryllium copper, and includes a planar base portion 40 for soldering to a surface 41, FIG. 2, of PWB 28, adjacent slot 32. This is accomplished by providing a solder pad 42 adjacent slot 32 for engagement with an undersurface 44, FIG. 3, of base portion 40.

Clip 38, FIGS. 3 and 4, also includes a retainer portion 46 which is bent at 48 to extend away from base portion 40 at an angle designated a. Retainer portion 46 includes an opening 50 formed therein which is vertically aligned with base portion 40 to permit a pick-and-place vacuum workpiece 51 to insert through opening 50 and engage an upper surface 52 of base portion 40 at the approximate center of mass of clip 38. In addition, an edge surface 54 of retainer portion 46 includes a lip 56 which extends at a slight angle designated b relative to retainer portion 46. Lip 56 comprises a portion of edge surface 54 which also includes a gripping portion 58.

Figure 5:
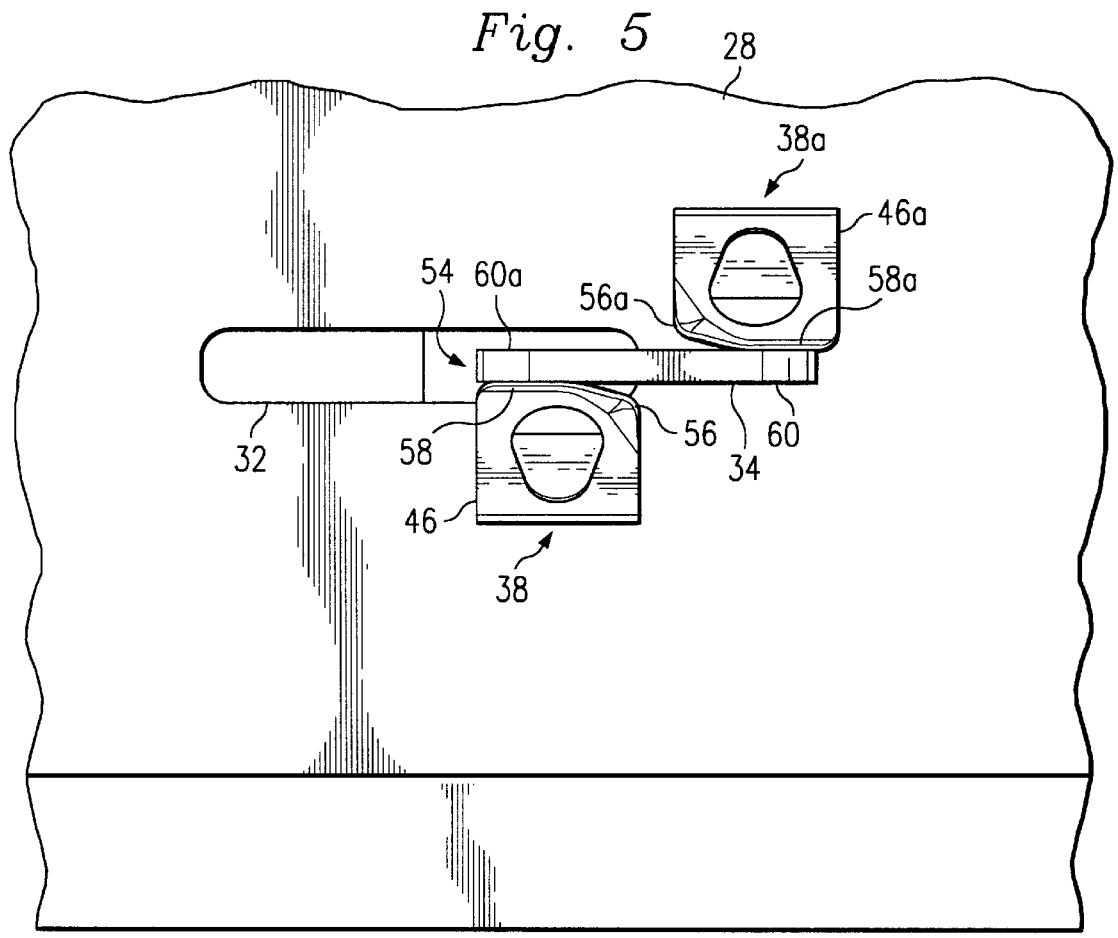
FIG. 5 is a top view illustrating an embodiment of a pair of grounding clips engaging a grounding hook.

As is best illustrated in FIG. 5, grounding clip 38 is mounted adjacent slot 32 in PWB 28 and also adjacent a surface 60 of hook 34. As is illustrated, gripping portion 58 of edge surface 54 engages hook surface 60. As is further illustrated, another grounding clip 38a is mounted adjacent slot 32 in engagement with a surface 60a of hook 34 such that both of the grounding clips 38, 38a are mounted on opposite sides of slot 32 so that their respective retainer portions 46, 46a face opposite directions, i.e. portions 46, 46a face each other and are offset. In this manner, gripping portions 58, 58a are positioned to frictionally engage opposite hook surfaces 60, 60a.

Figure 6:
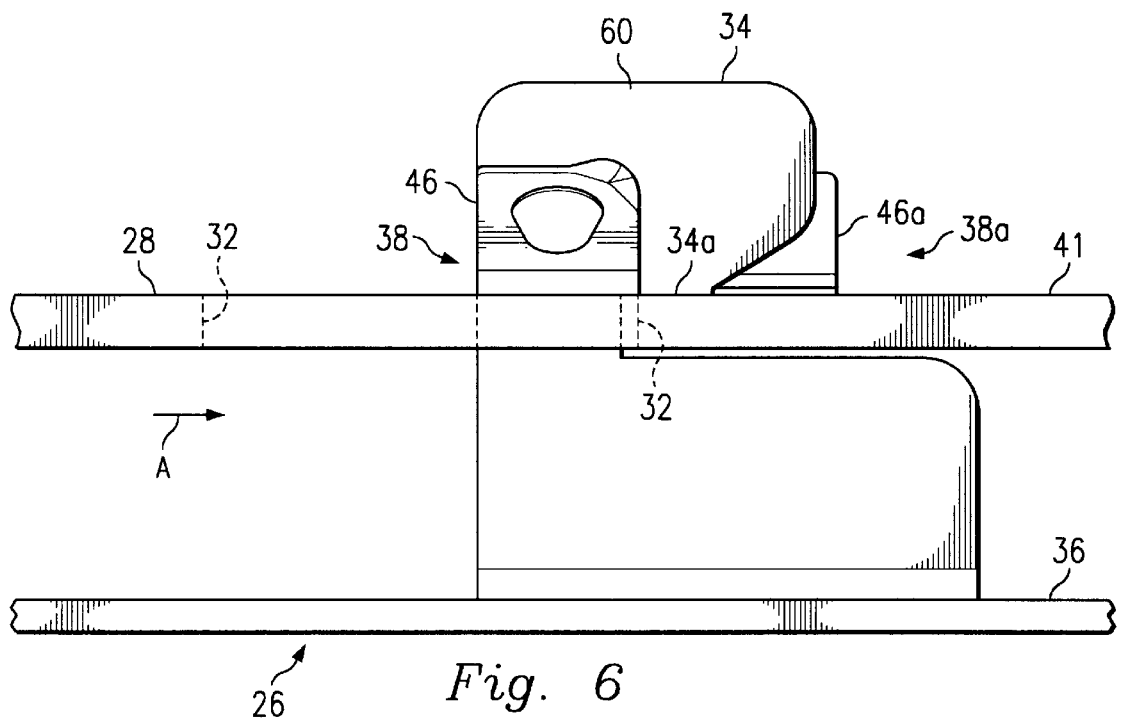
FIG. 6 is a side view illustrating the grounding clips of FIG. 5.

In a further illustration, hook 34, FIG. 6, extends upwardly from surface 36 of chassis 26 and is inserted through slot 32 formed in PWB 28. After insertion, PWB 28 is shifted in the direction of an arrow designated A so that undercut 34a engages surface 41 of PWB 28. Retainer portion 46 of clip 38 engages surface 60 of hook 34. Also, partially visible is opposing retainer portion 46a of clip 38a thus permitting retainer portion 46a of clip 38a to engage surface 60a (not visible in FIG. 6) of hook 34.

Figure 7:
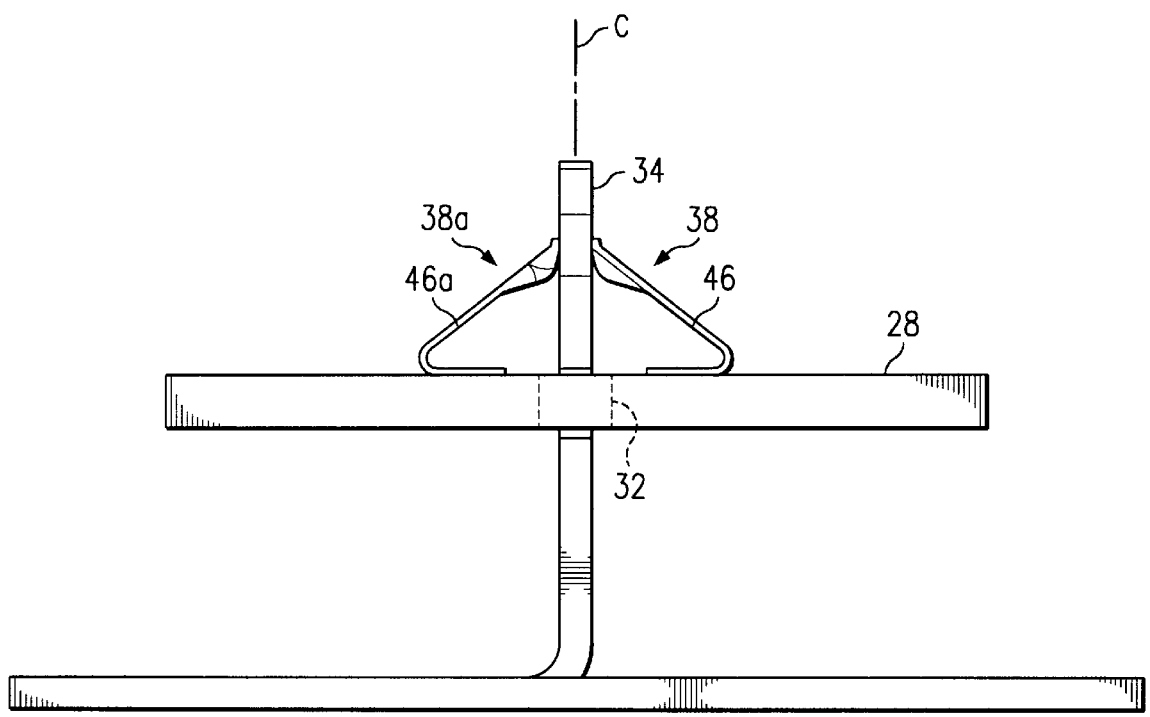
FIG. 7 is an end view illustrating the grounding clips of FIG. 5.

In a further illustration, opposing clips 38, 38a, FIG. 7, include respective overlapping opposed retainer portions 46, 46a which are positioned overcenter, indicated by a line designated C of slot 32. In this manner, hook 34 is frictionally engaged by retainer portions 46, 46a so that when hook 34 is inserted between opposing clips 38, 38a, hook 34 urges opposed retainer portions 46, 46a apart. Sliding of PWB 28 relative to hook 34 is facilitated in that the offset retainer portions 46, 46a, FIG. 5, include the angled lips 56, 56a which reduce resistance during movement of retainer portions 46, 46a relative to hook 34.

In operation, a pair of clips are positioned on the component board on opposite sides of each slot. The components are placed on the board by a pick-and-place vacuum workpiece, and positioned in an offset manner with their respective retainer portions facing in opposite directions, i.e. toward each other. The clips are seated with their base portions in contact with a solder pad. Oven exposure provides heat which welds the clips to the pads. The boards also have other surface mount components secured thereto in the same manner, whereas through-hole components are wave soldered to an opposite side of the board in a separate operation.

When completed boards are mounted in the computer chassis, the slots and hooks are aligned and the hooks insert through the slots. Once inserted, the hooks urge the opposed retainer portions of the clips apart. The board is then shifted relative to the hooks so that the undercut of each hook overlaps a portion of the board adjacent the slot to provide a mechanical connection. Shifting of the board relative to the hooks is facilitated due to the lip formed on an edge surface of the retainer portions. When the shifting is completed, each clip of the clip-pair engages an opposite side of the respective hook to provide a ground connection with the chassis. A final, single threaded connection is made to secure the board and chassis.

Board removal is achieved by disengaging the threaded connection and then reverse shifting the board to position the hook undercut out of engagement with the board. The board is then lifted so that each hook is withdrawn through its respective slot.

As it can be seen, the principal advantages of these embodiments are that because the clips are pick-and-place SMT components, the installation cost is substantially reduced, and the SMT assembly process is more easily controlled than manual assembly. Degradation in performance is reduced because there is less damage to components during shipping and handling. This is because the clips are stored and shipped in an embossed tape and reel similar to other SMT components. In addition to a reduction in assembly costs, the component cost for each clip is lower than previous clips. This is because substantially less material is used to form the blanks for the clips. Furthermore, the new, simpler geometry is substantially easier to manufacture. The clips are formed of an alloy that is six times more conductive than previous clips. Current clips are formed of BeCu 290TM04 having a conductivity of 1190 BTU/ft. hr. F°. The new clips are formed of BeCu 174 HT having a conductivity of 7425 BTU/ft. hr. F°.

Another advantage is that because the clips are surface mounted as opposed to previously used through-hole mounted clips, the PWB thickness does not matter. Clips which are through-hole mounted must be able to accommodate various PWB thicknesses such as 0.061" and 0.092" thick boards. In addition, the surface mounted clips do not hinder routing traces within the PWB as does a through-hole mounted clip. This advantage facilitates PWB design considerations and manufacturability.

Current clips have a U-shaped one-piece construction and include a built-in gap of from 0.010" to 0.020" between the grounding flanges due to the spring back in the clip material. The new clip requires two independent parts which require no built-in gap. In fact, the grounding flanges may overlap to provide a higher frictional contact with the hook, and the clip construction is therefore more robust.

As a result, one embodiment provides a surface mount grounding clip including a base portion and a retainer portion. The retainer portion extends angularly away from the base portion. The retainer portion includes an opening for inserting a pick and place vacuum workpiece. A lip is formed on an edge surface of the retainer portion. The lip extends at an angle relative to the retainer portion.

Another embodiment provides a computer system including a chassis. A microprocessor is mounted in the chassis. An input is coupled to provide input to the microprocessor. A mass storage is coupled to the microprocessor in the chassis. A display is coupled to the microprocessor by a video controller and a memory is coupled to provide storage to facilitate execution of computer programs by the microprocessor in the chassis. A component board is mounted in the chassis. A grounding clip including a base portion is mounted on one surface of the component board. A retainer portion of the grounding clip extends angularly away from the base portion and has an opening formed therein. A lip is formed on an edge surface of the retainer portion and extends at an angle relative to the retainer portion.

A further embodiment provides a chassis having a hook extending from a chassis surface. A component board is mounted in the chassis so that the hook extends through a slot formed in the component board. A grounding clip includes a base portion mounted on one surface of the component board. A retainer portion of the grounding clip extends angularly away from the base portion and has an opening formed therein. A lip is formed on an edge surface of the retainer portion and extends at an angle relative to the retainer portion.

A further embodiment provides a method of securing a computer chassis to a ground conductor by mounting a component board having a slot formed therein to engage a hook extending from the computer chassis, mounting a base portion of a grounding clip on a surface of the component board adjacent the slot, and engaging the hook with a lip of a retainer portion of the grounding clip. The retainer portion extends angularly away from the base portion and the lip extends at an angle relative to the retainer portion.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A surface mount grounding clip comprising:
   a base portion;
      a retainer portion extending from the base portion at a first angle, the retainer portion having an opening formed therein;
      the retainer portion having a terminal edge surface defined between two adjacent side surfaces; and
      a lip extending from the retainer at a second angle, the lip including the terminal edge surface and a portion of one of the side surfaces.

2. The grounding clip as defined in claim 1 wherein the opening formed in the retainer portion is vertically aligned with the base portion.

3. A computer system comprising:
   a chassis having a hook extending from a surface thereof;
   a microprocessor mounted in the chassis;
   an input coupled to provide input to the microprocessor;
   a mass storage coupled to the microprocessor;
   a display coupled to the microprocessor by a video controller;
   a memory coupled to provide storage to facilitate execution of computer programs by the microprocessor;
   a component board mounted in the chassis;
   grounding means including a base portion for mounting on one surface of the component board;
   a retainer portion of the grounding means extending from the base portion at a first angle, the retainer portion resiliently urged against the hook;
   the retainer portion having a terminal edge surface defined between two adjacent side surfaces; and
   a lip extending from the retainer at a second angle and engaged with the hook, the lip including a terminal edge surface and a portion of one of the side surfaces.

4. The computer system as defined in claim 3 wherein the opening formed in the retainer portion is vertically aligned with the base portion.

5. The computer system as defined in claim 3 wherein the component board includes a slot formed therein and the chassis includes a hook extending through the slot.

6. The computer system as defined in claim 5 wherein the grounding means is mounted adjacent the slot and the edge surface of the grounding means engages a surface of the hook.

7. The computer system as defined in claim 6 further comprising another grounding means for mounting adjacent the slot.

8. The computer system as defined in claim 7 wherein the grounding means are mounted on opposite sides of the slot so that their respective retainer portions face opposite directions for engaging opposite surfaces of the hook.

9. A computer chassis comprising:
   a chassis having a hook extending from a surface thereof;
   a component board mounted in the chassis, the component board including a slot formed therein, the hook extending through the slot;
   a grounding clip including a base portion mounted on one surface of the component board;
   a retainer portion of the grounding clip extending from the base portion at a first angle, the retainer portion resiliently urged against the hook;

the retainer portion having a terminal edge surface defined between two side surfacesl and a lip extending from the retainer at a second angle and engaged with the hook, the lip including the terminal edge surface and a portion of one of the side surfaces.

10. The computer chassis as defined in claim 9 wherein the opening formed in the retainer portion is vertically aligned with the base portion.

11. The computer chassis as defined in claim 9 wherein the grounding clip is mounted adjacent the slot.

12. The computer chassis as defined in claim 11 wherein the edge surface of the grounding clip engages a surface of the hook.

13. The computer chassis as defined in claim 12 further comprising another grounding clip mounted adjacent the slot.

14. The computer chassis as defined in claim 13 wherein the grounding clips are mounted on opposite sides of the slot so that their respective retainer portions face opposite directions at an offset for engaging opposite surfaces of the hook.

15. A method of securing a computer chassis to a ground conductor comprising the steps of:

mounting a component board having a slot formed therein to engage a hook extending from the computer chassis;

forming a grounding clip including a base, a retainer portion extending from the base at a first angle, and a lip extending from the retainer portion at a second angle for resiliently engaging the hook;

mounting the base portion of the grounding clip on a surface of the component board adjacent the slot; and slidably engaging the hook with the lip of the retainer portion.

16. The method as defined in claim 15 comprising the further step of forming an opening in the retainer portion.

17. The method as defined in claim 16 wherein the step of mounting the base portion further comprises the steps of extending a pick-and-place vacuum workpiece through the opening in the retainer portion, engaging the base portion with the vacuum workpiece, and placing the grounding clip on the component board adjacent the slot.

18. A surface mount grounding clip comprising:

a base portion;

a retainer portion resiliently connected to extend over the base portion at a first angle;

the retainer portion having a terminal edge surface; and a curved lip extending from the terminal edge surface of the retainer portion at a second angle.

* * * * *